United States Patent
Mackey et al.

(10) Patent No.: US 10,664,676 B2
(45) Date of Patent: May 26, 2020

(54) SYSTEMS AND METHODS FOR REDUCING UNWANTED REFLECTIONS IN DISPLAY SYSTEMS INCORPORATING AN UNDER DISPLAY BIOMETRIC SENSOR

(71) Applicant: WILL SEMICONDUCTOR (SHANGHA) CO. LTD., Shanghai (CN)

(72) Inventors: Bob Lee Mackey, San Jose, CA (US); Patrick Smith, San Jose, CA (US); Erik Jonathon Thompson, San Jose, CA (US); Arash Akhavan Fomani, Saratoga, CA (US); Marek Mienko, San Jose, CA (US)

(73) Assignee: Will Semiconductor (Shanghai) Co. Ltd., Shanghai (CN)

(*) Notice: Subject to any disclaimer, the term of this patent is extended or adjusted under 35 U.S.C. 154(b) by 0 days.

(21) Appl. No.: 15/990,353

(22) Filed: May 25, 2018

(65) Prior Publication Data
US 2018/0357462 A1    Dec. 13, 2018

Related U.S. Application Data

(60) Provisional application No. 62/518,582, filed on Jun. 12, 2017.

(51) Int. Cl.
*G06K 9/00* (2006.01)
*G02F 1/137* (2006.01)
(Continued)

(52) U.S. Cl.
CPC ........ *G06K 9/00013* (2013.01); *G01J 1/0429* (2013.01); *G02B 5/3025* (2013.01);
(Continued)

(58) Field of Classification Search
CPC ............ G06K 9/00013; G06K 9/0002; G06K 9/0004; G06K 9/00087; G06K 9/2054;
(Continued)

(56) References Cited

U.S. PATENT DOCUMENTS 10,339,359 B2 *    7/2019    Zhang
2007/0206842 A1    9/2007    Hamid
(Continued)

FOREIGN PATENT DOCUMENTS

KR    10-2016-0056389    5/2016
WO    WO16-154378 A1    9/2016

OTHER PUBLICATIONS

Search Report, dated Sep. 21, 2018, in International Patent Application No. PCT/US2018/037144.
(Continued)

*Primary Examiner* — Utpal D Shah
(74) *Attorney, Agent, or Firm* — Christensen O'Connor Johnson Kindness PLLC

(57) ABSTRACT

An optical sensor system includes a display substrate, display pixel circuitry including a plurality of light emitting display elements or pixels disposed over the display substrate, a first circular polarizer disposed over the display substrate and the display pixel circuitry, and a transparent cover sheet disposed over the first circular polarizer. A top surface of the transparent cover sheet provides a sensing surface for an object such as a finger. The optical sensor system also includes a sensor layer disposed below the display substrate, the sensor layer having a plurality of photosensors, and a second circular polarizer disposed between the sensor layer and the display substrate.

19 Claims, 13 Drawing Sheets

(51) Int. Cl.
  *G02B 5/30* (2006.01)
  *H01L 27/32* (2006.01)
  *G01J 1/04* (2006.01)
  *G02F 1/1333* (2006.01)
  *H01L 51/52* (2006.01)
  *G06T 7/73* (2017.01)
  *G02F 1/133* (2006.01)
  *G06K 9/20* (2006.01)
  *G06K 9/42* (2006.01)
  *G06K 9/46* (2006.01)
  *G06T 3/40* (2006.01)
  *H01L 25/16* (2006.01)
  *G02F 1/1368* (2006.01)

(52) U.S. Cl.
  CPC .......... *G02F 1/137* (2013.01); *G02F 1/13318* (2013.01); *G02F 1/13338* (2013.01); *G06K 9/0004* (2013.01); *G06K 9/00026* (2013.01); *G06K 9/00087* (2013.01); *G06K 9/2054* (2013.01); *G06K 9/42* (2013.01); *G06K 9/4661* (2013.01); *G06T 3/40* (2013.01); *G06T 7/74* (2017.01); *H01L 25/167* (2013.01); *H01L 27/323* (2013.01); *H01L 27/3227* (2013.01); *H01L 27/3234* (2013.01); *H01L 51/5281* (2013.01); *G02F 1/1368* (2013.01); *G02F 2001/133331* (2013.01); *G02F 2201/50* (2013.01); *G06T 2207/20221* (2013.01)

(58) Field of Classification Search
  CPC .......... G06K 9/42; G06K 9/4661; G06T 7/74; G06T 3/40; G01J 1/0429; G02B 5/3025; G02F 1/13318; G02F 1/137
  See application file for complete search history.

(56) References Cited

U.S. PATENT DOCUMENTS

| | | |
|---|---|---|
| 2014/0355846 A1 | 12/2014 | Lee et al. |
| 2016/0078270 A1 | 3/2016 | Lee et al. |
| 2018/0012069 A1* | 1/2018 | Chung ................. A61B 5/1172 |
| 2018/0046837 A1* | 2/2018 | Gozzini ............... G06K 9/0004 |
| 2018/0239146 A1* | 8/2018 | Bierhuizen ........ G02B 27/0172 |
| 2018/0267307 A1* | 9/2018 | Yoshida ................. G02B 27/01 |
| 2019/0041746 A1* | 2/2019 | Qi .......................... G03F 7/0007 |
| 2019/0114457 A1* | 4/2019 | Li ........................ G02F 1/13318 |
| 2019/0196174 A1* | 6/2019 | Park ..................... G02B 25/001 |
| 2019/0235145 A1* | 8/2019 | Sharp .................. G02B 5/3025 |

OTHER PUBLICATIONS

Written Opinion, dated Sep. 21, 2018, in International Patent Application No. PCT/US2018/037144.

Jain, Anil K., "Filterbank-Based Fingerprint Matching," IEEE Transactions on Image Processing, vol. 9, No. 5, May 2000, pp. 846-859, Department of Computer Science and Engineering, Michigan State University, East Lansing, MI.

* cited by examiner

SYSTEMS AND METHODS FOR REDUCING UNWANTED REFLECTIONS IN DISPLAY SYSTEMS INCORPORATING AN UNDER DISPLAY BIOMETRIC SENSOR

CROSS-REFERENCE TO RELATED APPLICATIONS

The present application claims the benefit under 35 U.S.C. § 119(e) of U.S. Provisional Application Ser. No. 62/518,582, filed Jun. 12, 2017, and titled "SYSTEMS AND METHODS FOR OPTICAL SENSING USING POINT-BASED ILLUMINATION," which is hereby incorporated by reference in its entirety.

BACKGROUND

Object imaging is useful in a variety of applications. By way of example, biometric recognition systems image biometric objects for authenticating and/or verifying users of devices incorporating the recognition systems. Biometric imaging provides a reliable, non-intrusive way to verify individual identity for recognition purposes. Various types of sensors may be used for biometric imaging including optical sensors.

SUMMARY

The present disclosure generally provides systems and methods for reducing unwanted reflections and improving biometric signal detection in display systems including an under display optical biometric sensor.

According to an embodiment, an optical sensor system is provided that includes a display substrate, display pixel circuitry (e.g., including a plurality of light emitting display elements or pixels) disposed over the display substrate, a first circular polarizer disposed over the display substrate and the display pixel circuitry, and a transparent cover sheet disposed over the first circular polarizer. A top surface of the transparent cover sheet provides a sensing surface for an object such as a finger. The optical sensor system also includes a sensor layer disposed below the display substrate, the sensor layer having a plurality of photosensors, and a second circular polarizer disposed between the sensor layer and the display substrate. A circular polarizer typically includes a quarter wave retarder plate and a linear polarizer that together act to circularly polarize light traversing both elements. In certain aspects, the system also includes a plurality of light emitters disposed over the display substrate, wherein the plurality of photosensors are configured to detect light emitted from the plurality of light emitters and returned through both the first circular polarizer and the second circular polarizer. In certain aspects, the system further includes an angular selective structure disposed between the plurality of photosensors and the second circular polarizer. In certain aspects, the angular selective structure includes a plurality of collimator filter elements. In certain aspects, the system further includes a light source disposed below the display substrate. In certain aspects, the system further includes a diffuser element disposed between the sensor light source and the display substrate. In certain aspects, the system further includes a birefringent material correction layer to correct for angular polarization effects disposed between a light source disposed below the display substrate and the second circular polarizer. In certain aspects, the system further includes a quarter wave retarder disposed over the first circular polarizer. In certain aspects, the quarter wave retarder is disposed over the transparent cover sheet. In certain aspects, a handedness of the first circular polarizer is the same as a handedness of the second circular polarizer.

According to another embodiment, an optical display device is provided that includes a display substrate, display pixel circuitry disposed over the display substrate, a circular polarizer disposed over the display substrate and the display pixel circuitry, a transparent cover sheet disposed over the circular polarizer, wherein a top surface of the transparent cover sheet provides a sensing surface for an object, and a quarter wave retarder disposed over the circular polarizer. In certain aspects, the quarter wave retarder is disposed over the top surface of the transparent cover sheet, wherein a top surface of the quarter wave retarder proximal the top surface of the transparent cover sheet provides the sensing surface for the object. In certain aspects, the quarter wave retarder is disposed between the transparent cover sheet and the circular polarizer. In certain aspects, the quarter wave retarder comprises a liquid crystal (LC) quarter wave retarder and a plurality of electrodes, wherein application of a voltage to the plurality of electrodes controls an activation state of the LC quarter wave retarder. In certain aspects, the device further includes an optical image sensor disposed below the LC quarter wave retarder, wherein the optical image sensor is configured to obtain a first image when the LC quarter wave retarder is activated and obtain a second image when the LC quarter wave retarder is de-activated. In certain aspects, the device further includes a second circular polarizer disposed below the display substrate. In certain aspects, the device further includes a sensor layer comprising a plurality of photosensors disposed below the circular polarizer.

According to yet another embodiment, an optical fingerprint sensor device is provided that includes an image sensor layer having a plurality of photosensors, an angular selective structure disposed over the image sensor layer, and a circular polarizer disposed over the image sensor layer, wherein the circular polarizer includes a quarter wave retarder layer disposed over a linear polarizer layer (e.g., linear polarizer is disposed between quarter wave retarder and image sensor layer). In certain aspects, the angular selective structure includes a plurality of collimator filter elements. In certain aspects, the device further includes a light source configured to illuminate a sensing area over the angular selective structure. In certain aspects, the device further includes a diffuser element disposed between the light source and the circular polarizer. In certain aspects, the device further includes a birefringent material correction layer to correct for angular polarization effects disposed between a light source and the second circular polarizer.

According to still a further embodiment, an optical display device is provided that includes a display substrate, a plurality of light emitting display pixels disposed above the display substrate, a circular polarizer disposed above the display substrate and the plurality of light emitting display pixels, and a quarter wave retarder disposed below the plurality of light emitting display pixels. In certain aspects, the quarter wave retarder is mounted below the display substrate. In certain aspects, the quarter wave retarder is integrated in the display substrate. In certain aspects, the device further includes a linear polarizer mounted below the quarter wave retarder. In certain aspects, the device further includes a transparent cover sheet disposed above the circular polarizer, wherein a top surface of the transparent cover sheet provides a sensing surface for an object. In certain aspects, the device further includes a sensor layer disposed below the linear polarizer, the sensor layer having a plurality of photosensors.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying figures. The use of the same reference numbers in different instances in the description and the figures may indicate similar or identical items.

DETAILED DESCRIPTION

The following detailed description is exemplary in nature and is not intended to limit the invention or the application and uses of the invention. Furthermore, there is no intention to be bound by any expressed or implied theory presented in the following detailed description or the appended drawings.

Turning to the drawings, and as described in greater detail herein, embodiments of the disclosure provide methods, devices and systems useful to optically image an input object such as a fingerprint.

Figure 1:
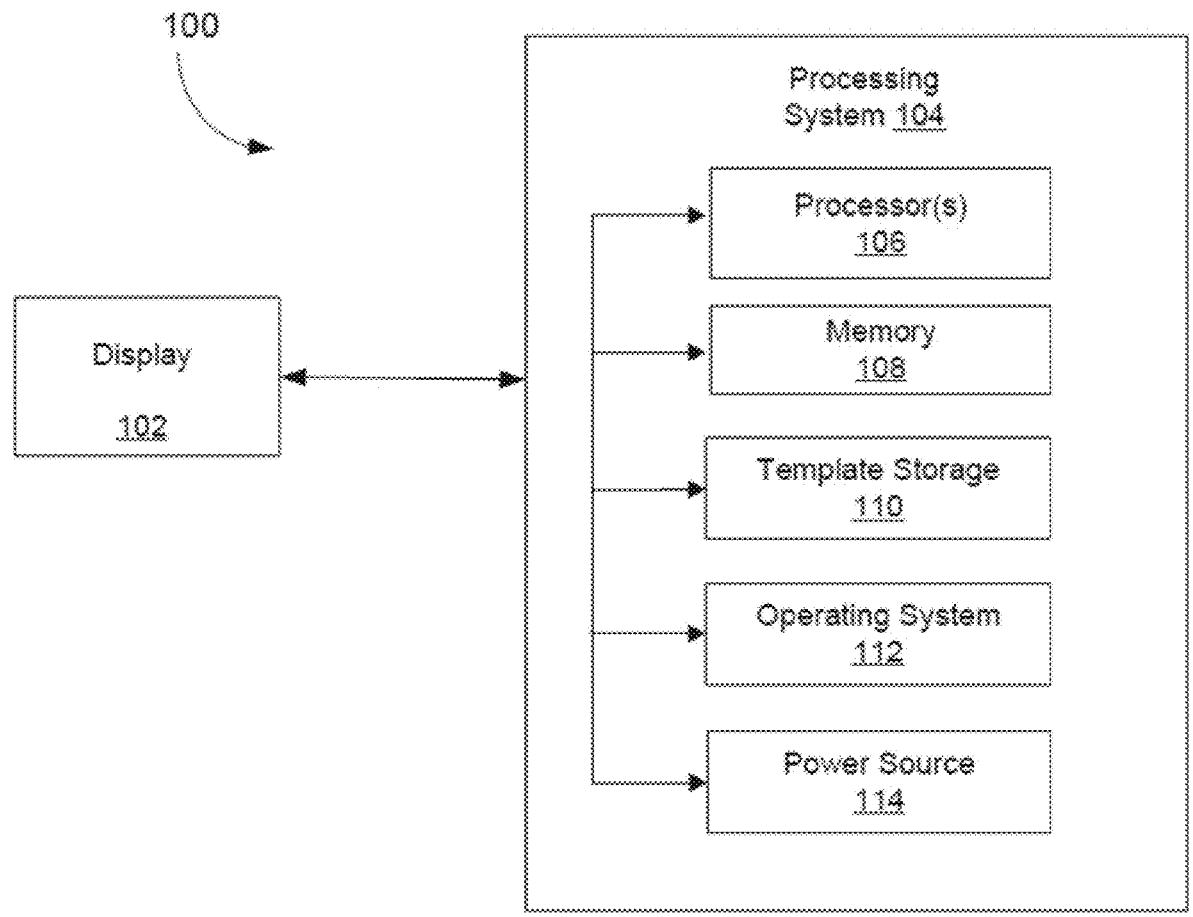
FIG. 1 is a block diagram of an example of an electronic system that includes a display device and a processing system, according to an embodiment.

FIG. 1 is a block diagram of an example of an electronic system 100 that includes a display device 102 and a processing system 104, according to an embodiment. In accordance with the embodiment, the display device 102 is also used as a sensor for imaging.

By way of example, basic functional components of the electronic device 100 utilized during capturing, storing, and validating a biometric match attempt are illustrated. The processing system 104 includes a processor(s) 106, a memory 108, a template storage 110, an operating system (OS) 112, and a power source(s) 114. Each of the processor(s) 106, the memory 108, the template storage 110, and the operating system 112 are interconnected physically, communicatively, and/or operatively for inter-component communications. The power source 114 is interconnected to the various system components to provide electrical power as necessary.

As illustrated, the processing system 104 may include processing circuitry including one or more processor(s) 106 configured to implement functionality and/or process instructions for execution within electronic device 100 and the processing system 104. For example, processor 106 executes instructions stored in memory 108 or instructions stored on template storage 110 to normalize an image, reconstruct a composite image, identify, verify, or otherwise match a biometric object, or determine whether a biometric authentication attempt is successful or unsuccessful. Memory 108, which may be a non-transitory, computer-readable storage medium, is configured to store information within electronic device 100 during operation. In some embodiments, memory 108 includes a temporary memory, an area for information not to be maintained when the electronic device 100 is turned off. Examples of such temporary memory include volatile memories such as random access memories (RAM), dynamic random access memories (DRAM), and static random access memories (SRAM). Memory 108 also maintains program instructions for execution by the processor 106.

Template storage 110 comprises one or more non-transitory computer-readable storage media. In the context of a fingerprint sensor device or system, the template storage 110 is generally configured to store enrollment views or image data for fingerprint images associated with a user's fingerprint, or other enrollment information, such as template identifiers, enrollment graphs containing transformation information between different images or view, etc. More generally, the template storage 110 may be used to store information about an input object. The template storage 110 may further be configured for long-term storage of information. In some examples, the template storage 110 includes non-volatile storage elements. Non-limiting examples of non-volatile storage elements include magnetic hard discs, solid-state drives (SSD), optical discs, floppy discs, flash memories, or forms of electrically programmable memories (EPROM) or electrically erasable and programmable (EEPROM) memories, among others.

The processing system 104 also hosts an operating system (OS) 112. The operating system 112 controls operations of the components of the processing system 104. For example, the operating system 112 facilitates the interaction of the processor(s) 106, memory 108 and template storage 110.

According to some embodiments, the processor(s) 106 implements hardware and/or software to obtain data describing an image of an input object. In some implementations, the processor(s) 106 may also align two images and compare the aligned images to one another to determine whether there is a match. The processor(s) 106 may also operate to reconstruct a larger image from a series of smaller partial images or sub-images, such as fingerprint images when multiple partial fingerprint images are collected during a biometric process, such as an enrollment or matching process for verification or identification.

The processing system 104 includes one or more power sources 114 to provide power to the electronic device 100. Non-limiting examples of power source 114 include single-use power sources, rechargeable power sources, and/or power sources developed from nickel-cadmium, lithium-ion, or other suitable material as well power cords and/or adapters which are in turn connected to electrical power.

Display 102 can be implemented as a physical part of the electronic system 100, or can be physically separate from the electronic system 100. As appropriate, the display 102 may communicate with parts of the electronic system 100 using any one or more of the following: buses, networks, and other wired or wireless interconnections. In some embodiments, display 102 is implemented as a fingerprint sensor to capture a fingerprint image of a user. More generally, the components of the display 102, or components integrated in or with the display (e.g., one or more light sources, detectors, etc.) is implemented to image an object. In accordance with some embodiments, the display 102 may use optical sensing for the purpose of object imaging including imaging biometrics such as fingerprints.

Some non-limiting examples of electronic systems 100 include personal computers of all sizes and shapes, such as desktop computers, laptop computers, netbook computers, tablets, web browsers, e-book readers, and personal digital assistants (PDAs). Additional example electronic systems 100 include data output devices (including display screens and printers). Other examples include remote terminals, kiosks, video game machines (e.g., video game consoles, portable gaming devices, and the like), communication devices (including cellular phones, such as smart phones), and media devices (including recorders, editors, and players such as televisions, set-top boxes, music players, digital photo frames, and digital cameras).

In some embodiments, the processing system 104 includes display driver circuitry, LED driver circuitry, receiver circuitry or readout circuitry for operating or activating light sources, or for receiving data from or reading out detectors in accordance with some embodiments described elsewhere in this document. For example, the processing system 104 may include one or more display driver integrate circuits (ICs), LED driver ICs, OLED driver ICs, readout ICs, etc.

Figure 2:
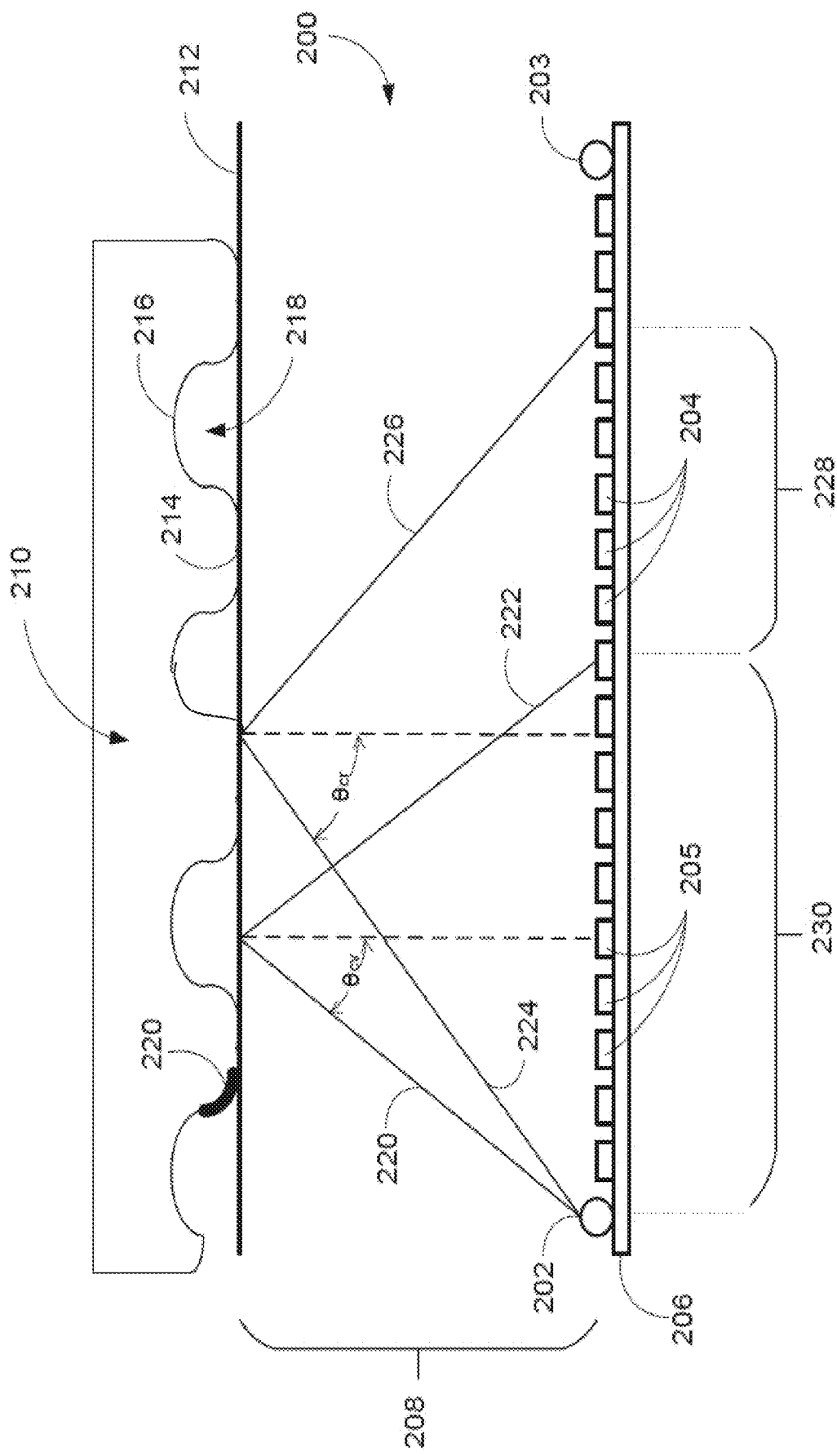
FIG. 2 illustrates an example of a display according to the present disclosure.

FIG. 2 illustrates an example of an optical display system 200 according to the present disclosure. The optical display system 200 (also referred to as "display 200") includes light sources, e.g., light sources 202 and 203, photosensors, e.g., detector pixels 204 and 205, a substrate 206, and a cover layer 208. Also shown is an input object 210, which is imaged by the display 200 in accordance with some embodiments. As described above, the display 200 may be a separate device or may be incorporated as part of various devices including mobile phones, media devices, and any other suitable electronic device 100.

The light sources 202 and 203 are of a suitable type described below (e.g., OLEDs, microLEDs, etc.). In some embodiments, the light sources 202 and 203 may include native display pixel emitters (e.g., one or more native OLED pixels), or dedicated emitters integrated in or with the display (e.g., microLEDs integrated in or with an OLED or LCD display). Although only two light sources 202, 203 are shown in FIG. 2, any number and any arrangement of light sources may be used. For example, only one light source may be used, two light sources may be used, or an array of multiple light sources may be used. The light sources 202, 203 may transmit light of the same wavelength or may transmit light of differing wavelengths (e.g., different colors). Moreover, wavelengths other than visible light may be transmitted.

The photosensors or detector pixels 204 and 205 may detect light transmitted from light sources 202, 203. Examples of types of photosensors are CMOS sensors, phototransistors and photodiodes. Thin film transistor-based sensors may also be used in accordance with some embodiments.

Although the light sources 202, 203 and photosensors 204, 205 are depicted as distinct elements, in some embodiments the same type of element may be used to both transmit light and detect transmitted light. For example, the light sources 202, 203 themselves may be reverse-biased to function as detector pixels, using LED, OLED, or another suitable display driver technology. The light sources 202, 203 can be individually reverse biased to function as detector pixels, or may be collectively reverse-biased, e.g., to function as row s or columns of detector pixels. Further, all of the light sources 202, 203 may be addressable in a reverse biased state, or a smaller subset may be addressable in a reverse bias state to minimize the amount of additional routing circuitry that is included, in which case the display 200 might include a special area of fingerprint sensing corresponding to those light sources 202, 203 that can be set to a reverse biased detector state. In addition, although the detector pixels 204, 205 are shown on the same substrate 206 as the light sources 202, 203, the detector pixels 204, 205 can be otherwise arranged within the device, such as for example, on a different plane from the light sources 202, 203.

The cover layer 208 may include a cover lens, cover glass, or cover sheet, which protects the inner components of the display 200, such as the light sources 202, 203 and the detector pixels 204, 205. The cover layer 208 may be made of any suitable material such as chemically strengthened glass, crystalline materials (e.g., synthetic sapphire), transparent polymeric materials, and the like. The cover layer 208 may also include one or more additional layers associated with display and/or touch screen functionality, such as capacitive touch screen functionality. The cover layer 208 may be transparent thereby allowing light from light sources 202, 203 and also the display's native emitter pixels (e.g., native OLED emitters) to be transmitted and observed outside of the display 200. A top surface of the cover layer 208 forms a sensing surface or input surface 212 which provides a contact area for the input object 210.

The input object 210 is an object to be imaged and may include a biometric object such as a fingerprint. Generally, the object 210 will have various characteristics. By way of example, the object 210 has ridges 214 and valleys 216. Due to their protruding nature, the ridges 214 contact the sensing surface 212 of the cover 208. In contrast, the valleys 216 do not contact the sensing surface 212 and instead form a gap 218 between the input object 210 and the sensing surface 212. The object 210 may have other characteristics, such as moisture or a stain or ink 220, that do not create significant structural differences in portions of the input object 210, but which may affect its optical properties.

The light sources 202, 203 transmit beams of light within the cover layer 208 and the transmitted light becomes incident on the sensing surface 212 of the cover layer 208 at various angles. At certain angles, some of the transmitted light is reflected and some of the transmitted light is refracted. However, for cases where no fingerprint ridge is present on the sensing surface 212, light beams which arrive at the sensing surface 212 at an angle exceeding a critical angle $\theta_c$ undergo total internal reflection, i.e., all light from the transmitted beam exceeding the critical angle is reflected at the sensing surface 212.

As will be appreciated, since the medium above the sensing surface 212 may vary, the critical angle at various points along the sensing surface 212 may likewise vary. For example, the ridges 214 of the input object 210 and gaps 218 formed within the valleys 216 of the object will have different indices of refraction. As a result, different critical angles will exist at the boundaries between the sensing surface 212 and ridges 214 as compared to the boundaries formed by the air gaps 218 and the sensing surface 212. These differences are illustratively shown in FIG. 2. Line 220 represents a beam of light transmitted from the light source 202 at the critical angle ($\theta_{cv}$) for a gap 218 and sensing surface 212 boundary, and line 222 represents the corresponding reflected beam. Line 224 represents a beam of light transmitted at the critical angle ($\theta_{cr}$) for a ridge 214 and sensing surface 212 boundary, and line 226 represents a corresponding reflected beam. Relative to light source 202, region 228 depicts an area on the substrate 206 that is bounded by reflected light resulting from light beams transmitted at the critical angles $\theta_{cv}$ and $\theta_{cr}$, or in other words is bounded by reflected beams 222 and 226.

In accordance with some embodiments, detector pixels 204 falling within region 228 are used to detect reflected light to image part of input object 210 when light source 202 is illuminated. With respect to the detection of ridges and valleys, region 228 is an area of relatively high contrast. The relative high contrast occurs because light reflected from the sensing surface in contact with valleys (e.g., air) undergoes total internal reflection whereas light reflected from the sensing surface 212 in contact with the input object 210 (e.g., skin) does not. Thus, light beams transmitted from display pixel 202 which have an angle of incidence at the sensing surface falling between $\theta_{cv}$ and $\theta_{cr}$ are reflected and reach detector pixels 204 falling within region 228.

In accordance with another aspect of the disclosure, detector pixels 205 falling within region 230 (relative to light source 202) may also be used to image the input object 210. In particular, transmitted beams from light source 202 which become incident on the sensing surface 212 with angles smaller than both critical angle of ridge ($\theta_{cr}$) and critical angle of valley ($\theta_{cv}$) result in reflected beams falling within region 230. Due to scattering, the contrast of reflected beams falling within region 230 from ridges and valleys may be less than the contrast of reflected beams falling within high contrast region 228. However, depending on factors such as the sensitivity of the detector pixels 204, 205 and resolution requirements, region 230 may still be suitable for sensing ridges and valleys on the input object 210. Moreover, region 230 may be suitable for detecting non-structural optical variations in the input object 210 such as moisture or stains or ink 220.

The critical angles $\theta_{cr}$ and $\theta_{cv}$ resulting from ridges 214 and gaps 218 at the sensing surface 212 are dependent on the properties of the medium in contact with the boundary formed at the sensing surface 212, which may be affected by a condition of the input object 210. For example, a dry finger in contact with the sensing surface 212 may result in a skin to air variation across the sensing surface 212 corresponding to fingerprint ridges and valleys, respectively. However, a wet finger in contact with the sensing surface 212 may result in a skin to water or other liquid variation across the sensing surface 212. Thus, the critical angles of a wet finger may be different from the critical angles formed by the same finger in a dry condition. Thus, in accordance with the disclosure, the intensity of light received at the detector pixels 204, 205 can be used to determine the relative critical angles, determine whether the object is wet or dry, and perform a mitigating action such as processing the image differently, providing feedback to a user, and/or adjust the detector pixels or sensor operation used for capturing the image of the object. If a wet object is detected, a user may also be notified so that the object can be dried before imaging.

Figure 3:
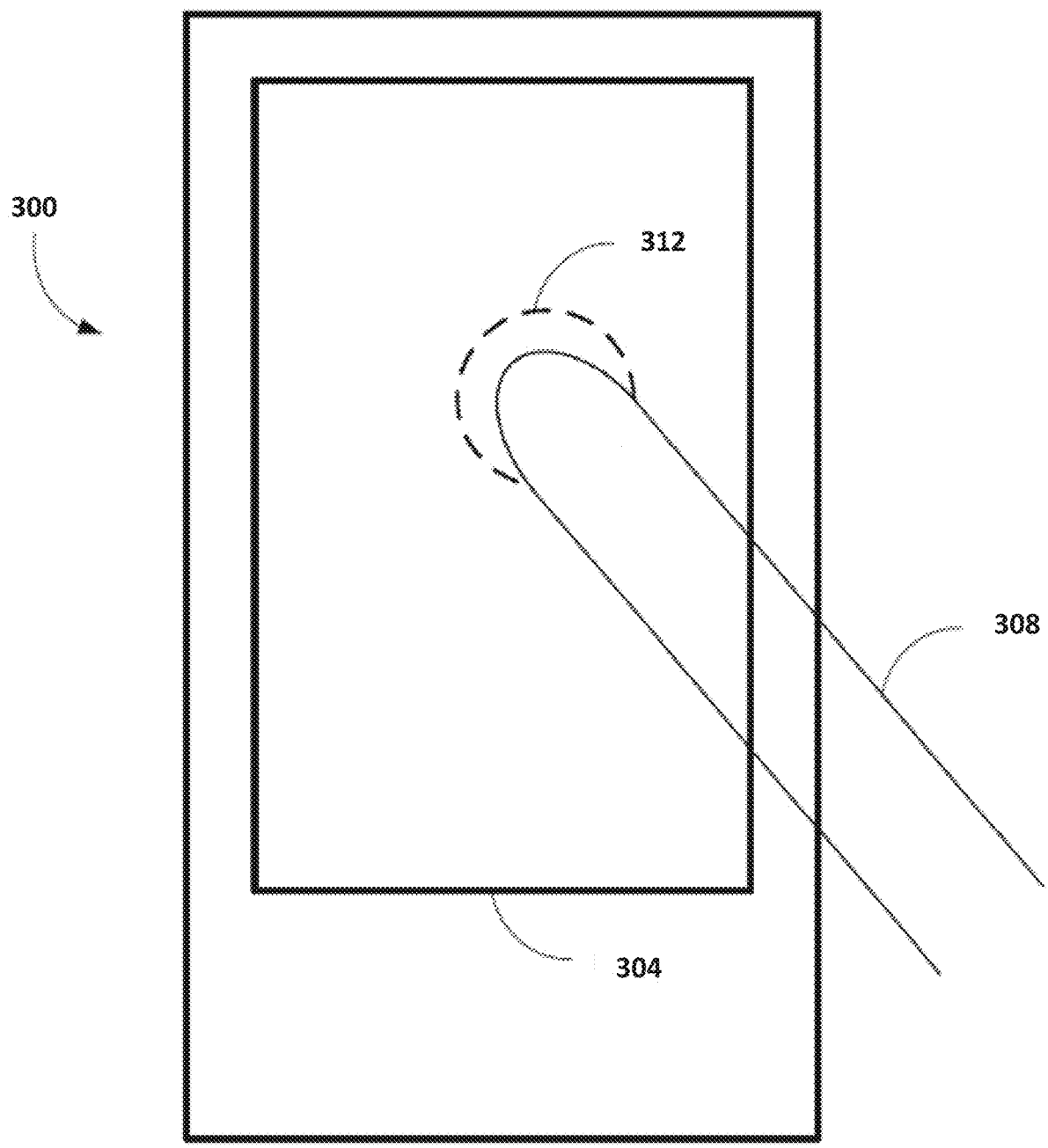
FIG. 3 illustrates a way to provide feedback during imaging of an object using a display according to the present disclosure.

FIG. 3 illustrates interaction of an object with an optical display system according to the present disclosure. Such feedback as mentioned above may be used, for example, to provide feedback to a user during acquisition of a fingerprint image in an enrollment and/or authentication process. As shown, the device 300 includes an active display area 304. The active display area 304 may encompass a portion of a surface of the device 300 as shown, or it may encompass the entire device surface or multiple portions of the device surface. Also, the sensing surface or input surface 312 may encompass a portion of the active display area 304 as shown, or the sensing surface 312 may encompass the entire active display area 604 or multiple portions of the active display area 304. An object 308, such as a finger, is placed over and in contact with the sensing surface 312 in the active display area 304. One or more light sources (not shown) underneath the object 308 are illuminated to image part or all of the object 308 in accordance with the previous description.

Referring back to FIG. 2, each of the light sources 202, 203 includes a light emitter (e.g., a light emitting device or material) configured to illuminate the sensing surface 212 for object detection. In some embodiments of the optical display system, each of the light sources 202, 203 includes a light emitting diode (LED), laser, or other electroluminescent device, which may include organic or inorganic materials and which may be electronically controlled or operated. In some embodiment, the light sources 202, 203 include a plurality of light sources, which may be arranged in a regular array or irregular pattern and which may be physically located together or spatially segregated in two or more separate locations. The light sources 202, 203 may emit light in a narrow band, a broad band, or multiple different bands, which may have one or more wavelengths in the visible or invisible spectrum, and the light sources 202, 203 may emit polarized or unpolarized light. In some embodiments, the light sources 202, 203 includes one or more dedicated light emitters which are used only for illuminating the sensing surface 212 for object detection. In some embodiments, the light sources 202, 203 include one more light emitters associated with one or more other functions of an electronic system, such as emitters used for displaying visual information or images to a user.

Each of the light detectors 204, 205 includes a light sensitive device or material configured to detect light from the sensing surface for object detection. In some embodiments of the display system, the light detectors 204, 205 include one or more photodiodes (PDs), charge coupled devices (CCDs), phototransistors, photoresistors, or other photosensors, which may include organic or inorganic materials and which may be electronically measured or operated. In some embodiments, the light detectors 204, 205 include a plurality of light sensitive components, which may be arranged in a regular array or irregular pattern and may be physically located together or spatially segregated in two or more separate locations. In some embodiments, the light detectors 204, 205 include one or more image sensors, which may be formed using a complementary metal-oxide-semiconductor (CMOS), a thin film transistor (TFT), or charge-coupled device (CCD) process. The light detector(s) may detect light in a narrow band, a broad band, or multiple different bands, which may have one or more wavelengths in the visible or invisible spectrum. The light detectors 204, 205 may be sensitive to all or a portion of the band(s) of light emitted by the light source(s) 202, 203.

The display system 200 may include one or more additional components not illustrated in FIG. 2 for simplicity. For example, in some embodiments, the display system 200 includes one or more additional optics or optical components (not pictured) to act on the light in the optical display system. The display system 200 may include one or more light guides, lenses, mirrors, refractive surfaces, diffractive elements, filters, polarizers, spectral filters, collimators, pinholes, or light absorbing layers, which may be included in the illumination optical path(s) or return optical path(s) and which may be used to modify or direct the light as appropriate for detection of the object(s) 210.

Figure 4:
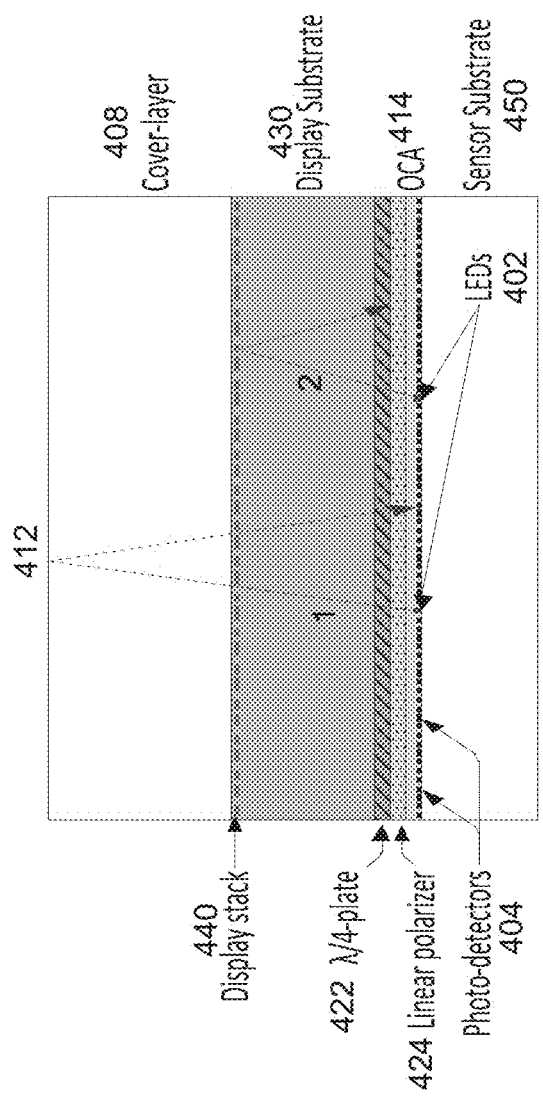
FIG. 4 illustrates an embodiment of an optical fingerprint sensor for fingerprint imaging through a display using a point illumination source scheme including a circular polarizer to absorb the light that is reflected from the display while allowing the reflections from a finger to arrive at the detector.
Figure 5:
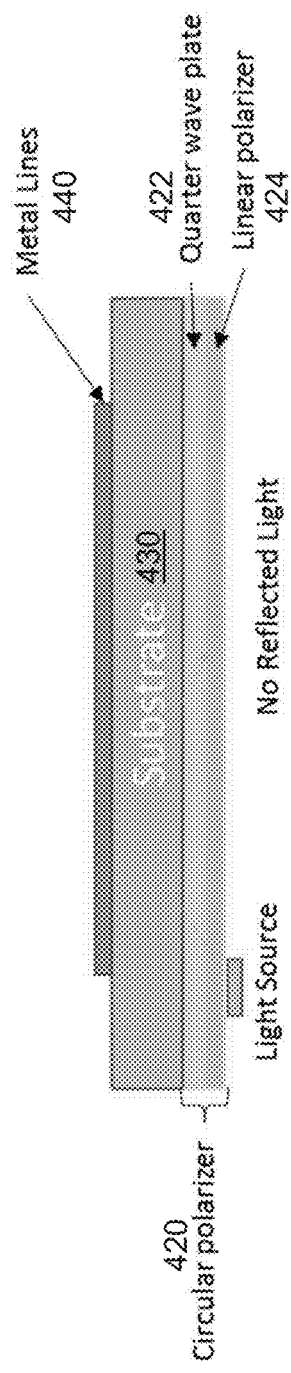
FIG. 5 illustrates another embodiment of an optical fingerprint sensor for fingerprint imaging through a display using a point illumination source scheme including a circular polarizer to absorb the light that is reflected from the display while allowing the reflections from a finger to arrive at the detector.

FIGS. 4-5 illustrate embodiments including a fingerprint sensor 450 and one or more illuminations sources 402 located under a display substrate (e.g., an OLED display) 430. In some implementations, the light budget available to the photo-detectors 404 can be substantially higher than collimator-based optical fingerprint sensors (OFPS). In a collimator based OFPS, the light that arrives at the sensor from above the display is attenuated by the display (e.g., in some implementations only 5% of the light passes the display) and the collimator (e.g., in some implementations 0.5% of the signal transmitted for a 1/10 collimator), resulting in only 0.025% total transmission. In contrast, using an illumination source (e.g., one or more point sources) scheme from under the display, less attenuation can result because of a double pass through the display resulting in 0.25% total transmission. However, if a light source is placed under the display, the reflection from the display may degrade the signal. For example, when an optical biometric sensor, such as an optical fingerprint sensor, with an illumination source (such as one or multiple light sources 402) is located under the display substrate 430, the light emitted by the illumination source 402 may be reflected from the display (e.g., metal lines 440 of the display stack on the display substrate 430) to the sensor and may degrade the quality of the biometric object image captured by the sensor. The intensity of this light can also be higher than the light reflecting or returning from the object (e.g., finger) or sensing surface itself and may reduce the dynamic range of the object (e.g., finger) signal that can be detected.

In certain embodiments suppressing these reflections at the back side of the display is accomplished using a circular polarizer layer disposed between the sensor substrate and the display. With reference to FIGS. 4-5, embodiments of an optical fingerprint sensor for fingerprint imaging through a display using an under-display illumination source scheme are shown, including a circular polarizer 420 to absorb the light that is reflected (2) from the display while allowing the reflections (1) from a finger to arrive at the sensor. The sensors of the embodiments in FIGS. 4-5 include an array of photo-detectors (photosensors) 404, one or more light sources 402, e.g., LEDs, and a circular polarizer layer 420 (including a quarter wave retarder layer or plate 422 and a linear polarizer 424) located between the photosensors 404 and the back of the display substrate 430 to minimize reflection from display layers, e.g., metal lines 440, in the display stack. FIG. 4 is similar to FIG. 5, but includes an optional layer (e.g., optically clear adhesive or "OCA") 414 under the display substrate 430, as well as a cover layer 408.

The circular polarizer 420 may be attached to (e.g., mounted to, adhered to or laminated to) the back of the display substrate 430 or to a topside of the sensor 450. In certain embodiments, the quarter wave retarder 422 is mounted below the display substrate 430. In other embodiments, the quarter wave retarder 422 is integrated in the display substrate 430. For example, the display substrate 430, carrying display emitters and pixel circuitry, can be made of, or otherwise include, a birefringent material having a thickness that forms the quarter wave retarder 422. The linear polarizer 424 can be mounted to or otherwise disposed below the quarter wave retarder 422 or display substrate 430 to form the circular polarizer 420 with quarter wave retarder 422.

Circular polarizer 420 operates to circularly polarize light emitted by the light sources 402 as will be described in more detail below. The circularly polarized light that reflects off of the display (e.g., reflects off of metal lines 440 in display stack) will again encounter the circular polarizer 420 which operates to block the returning, reflected light while allowing the light from the (finger) sensing surface 412 to pass through due to different reflectivity characteristics of these interfaces as will be described below with reference to FIG. 8.

In certain embodiments, an optional light-absorptive coating (e.g., black mask; not shown) may be used to cover parts of the sensor substrate that are not occupied by the photo-detectors 404, and may be located on either or both the display substrate 430 and the sensor substrate 450. The circular polarizer 420 and optional absorptive layer(s) advantageously minimize direct light reflections from reaching the detectors without first being reflected from the glass-finger interface, hence improving the quality of captured images. The circular polarizer 420 and optional absorptive layer(s) also advantageously prevent light from multiple reflections between the display and sensor that can reduce and blur image quality by expanding the effective size of the illumination source.

In certain optical finger print sensors, display light may be used to illuminate the sensing surface and hence the biometric object. For a finger, the sensor registers the difference in the light between ridges and valleys. Because light from a valley is subject to glass-air interface reflection and light from a ridge is not, in cases where the illumination is coming from under the finger, the additional reflection at that interface may add to the light detected by the sensor. This may make valleys appear brighter than ridges. And if the light is coming from above or inside of the finger, the air-glass interface may subtract from the light detected by the sensor. Here, a valley may appear darker than a ridge. This can lead to inconsistent images based on the changing condition of the finger (i.e. dry or normal) or changing amount of light that is scattered back by the tissue in the finger. Removing the light reflected from this interface may make the images less sensitive to varying finger or illumination conditions.

Figure 6:
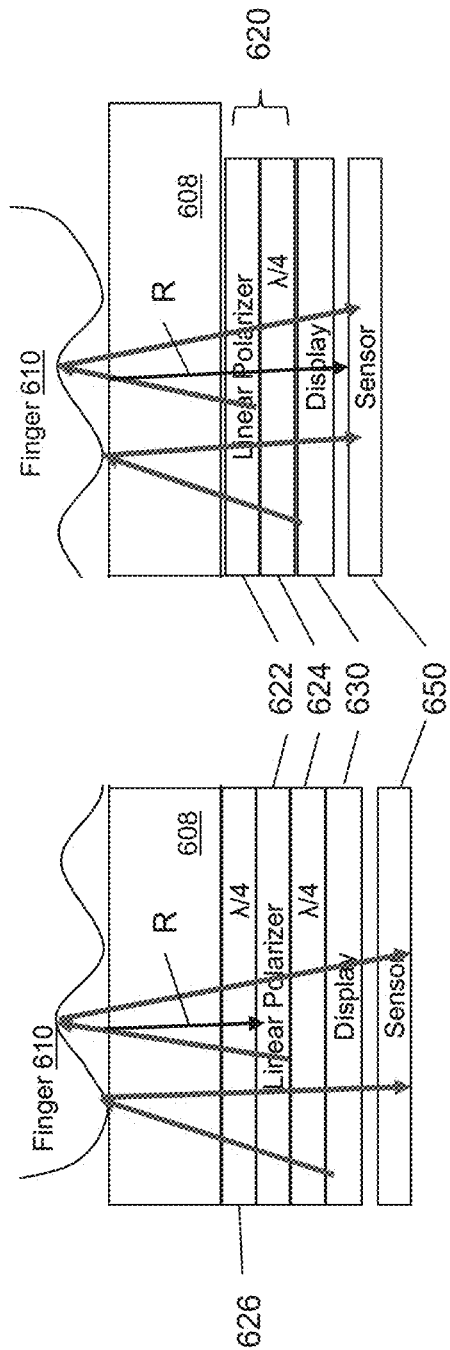
FIG. 6A illustrates an optical display device stack-up according to an embodiment.
FIG. 6B illustrates a conventional display stack-up.

One way to alleviate this problem is to eliminate the additional reflection from the air-glass interface. FIG. 6 illustrates both an optical display device stack-up according to an embodiment (FIG. 6A) and a conventional display stack-up (FIG. 6B). Given that the light from both OLED or LCD panels is polarized due to conventional circular polarizer 620, in one embodiment as shown in FIG. 6A, quarter wave retarder 626 is added above circular polarizer 620, e.g., aligned at 45 degrees relative to the polarization axis of polarizer 620. Light illuminating the finger 610 will be circularly polarized due to the quarter wave retarder 626 and direct specular reflection from the glass-air interface will be absorbed by the polarizer 622, in a similar fashion to the way internal display reflections are absorbed by circular polarizer 620 before they reach the eye (see, e.g., FIG. 7, discussed in more detail below). In the present embodiment, as shown in FIG. 6A, light emitted by the display 630 and interacting with the finger 610 (ridge or valley) and impinging back toward the sensor 650 will pass through to sensor 650, whereas light reflecting (designated as "R") from the glass-air interface will be absorbed by the linear polarizer 622. To the human eye, the displayed image will not be affected and it will even be more view angle independent for someone using polarized sunglasses, although at reduced brightness. In contrast, in the absence of an additional quarter wave retarder 626 as shown in FIG. 6B, light emitted by the display 630 and reflecting from the glass-air interface will pass through to the sensor 650 thereby adversely affecting optical detection performance of sensor 650.

Figure 7:
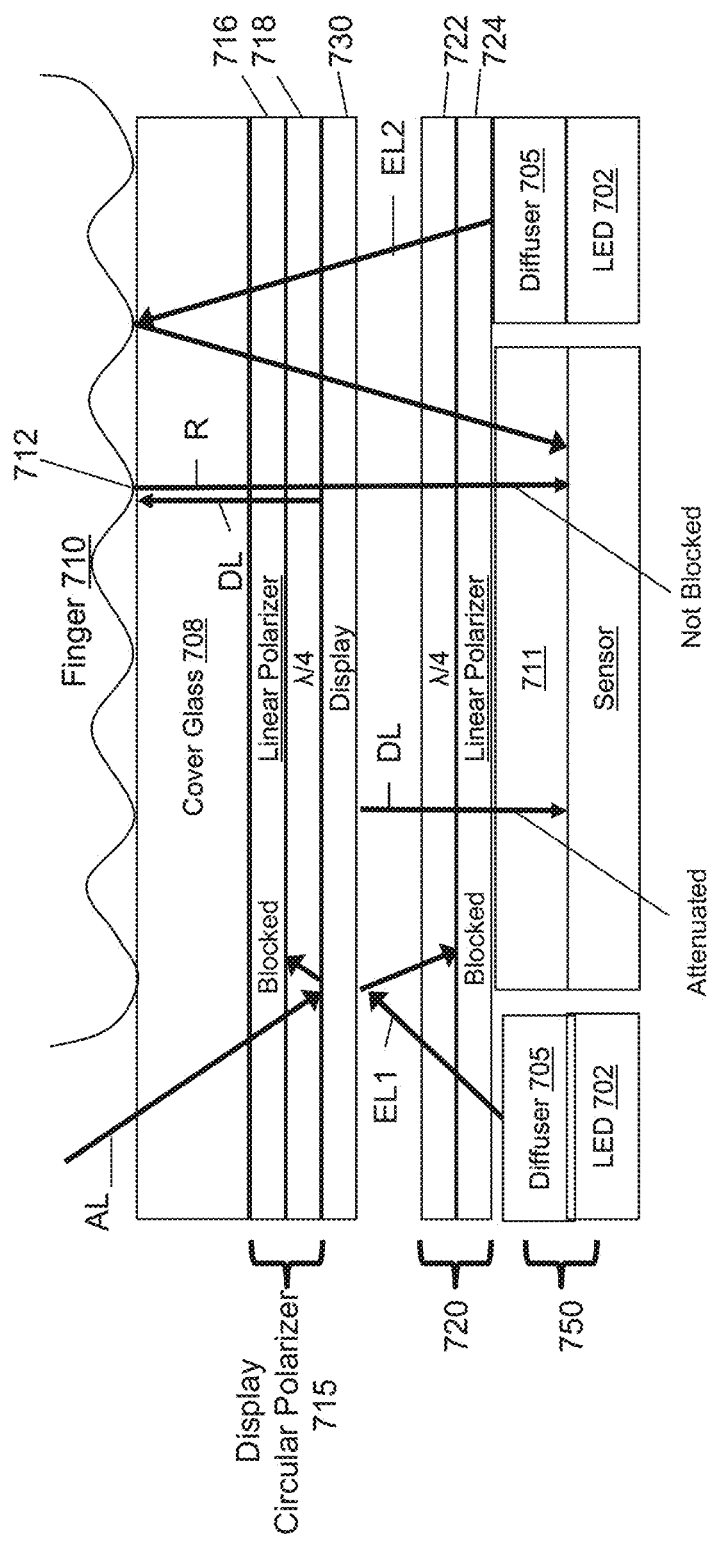
FIG. 7 shows another embodiment of an optical display device stack-up, including a circular polarizer positioned between a display layer and a sensor layer.

FIG. 7 shows another embodiment of an optical display device stack-up, including a circular polarizer 720 positioned between a display layer 730 and a sensor layer 750. The circular polarizer 720 may be mounted to or attached to a sensor module 750 below the display 730 as shown. Circular polarizer 720 will polarize the background light emitted by the display (designated as display light or "DL"), which will attenuate it by approximately 50%. The light emitted by the display, DL, and reflected from the finger (designated as "R") at the sensing surface 712 is polarized, and therefore attenuated, by the circular polarizer 715 above the display regardless; if the "handedness" of polarizer 720 (i.e., right-handed circular polarizer or left-handed circular polarizer) is the same as the "handedness" of the display circular polarizer 715, then the polarizer 720 will pass this already-polarized (reflected-by-the-finger) light R unaffected. Therefore, polarizer 720 can attenuate the background (undesired) light emitted by the display, but does not impact the fingerprint light.

Figure 8:
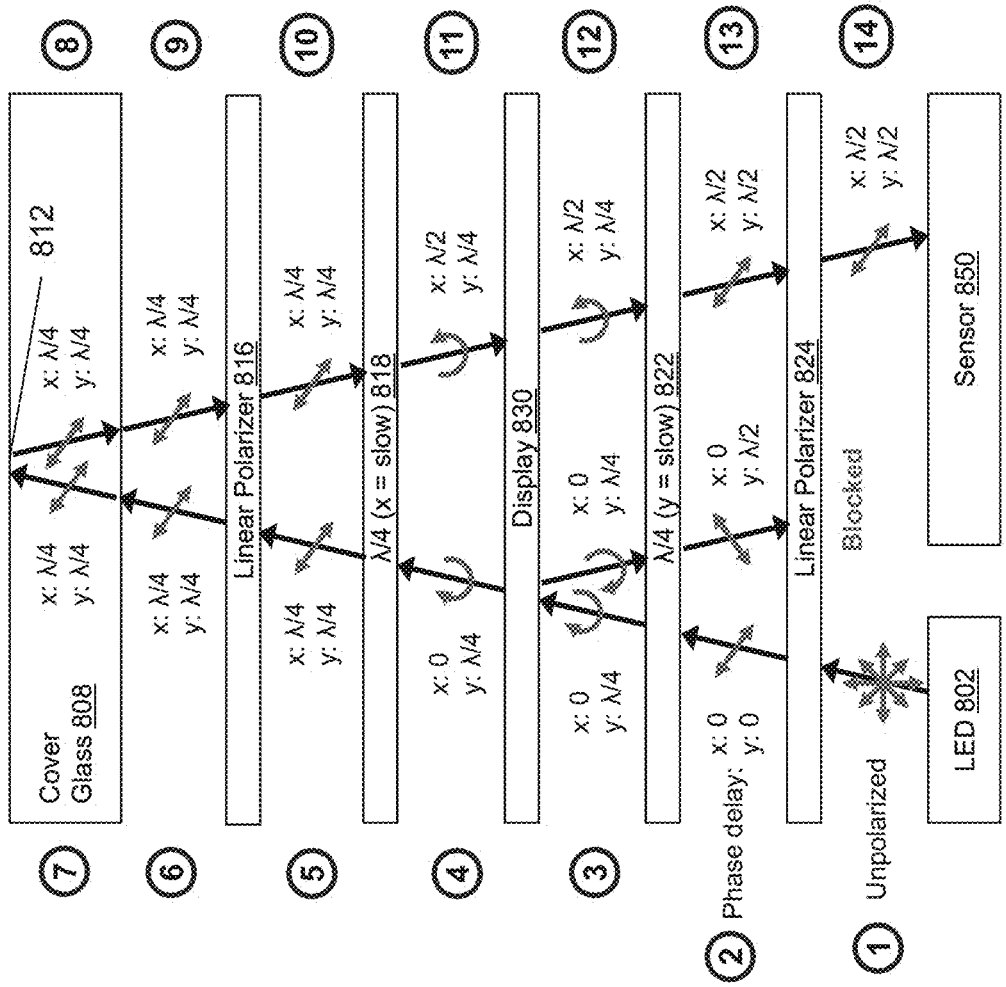
FIG. 8 shows the (polarization) behavior of the light after each interacting with each layer of FIG. 7.

Appropriate selection of the "handedness" of polarizer 720 also allows the fingerprint sensor polarizer to block reflections from a light source beneath the display the same way the display circular polarizer 715 blocks reflections or glare as shown by the ambient light ("AL") impinging on the display (arrow from upper left), reflecting off the display 730 and being absorbed (or blocked) by the linear polarizer 716 in the display circular polarizer 715. That is, emitted light (designated as "EL1") from the LED 702 that reflects off of display 730 will be absorbed/blocked by linear polarizer 724. However, the light (designated as "EL2") emitted from the LED 702 that travels to the finger 710 on sensing surface 712 and is reflected back to the sensor (through both polarizers) is largely unaffected. FIG. 8 will describe in more detail an example of how the polarization changes through these various layers. For simplicity, FIG. 8 describes how the polarization changes when the orientations of the two linear polarizers 716, 724 are aligned. However, the polarization behaves the same when the orientations are not aligned (i.e., the linear polarizers 716, 724 are rotated relative to each other), and therefore FIG. 8 represents a special case of the general behavior of the light polarization through the various elements/layers.

In certain embodiments, the "handedness" of the circular polarizer 720 is the same as the handedness of the display circular polarizer 715, wherein the linear polarizers 724, 716 have a same orientation with respect to the fast and slow axes of the quarter wave retarders 722, 718, e.g., +/−45 degrees, or the same right/left circular polarization.

In certain embodiments, sensor layer 750 includes one or more sensor light sources 702 such as an LED point source. An optional diffuser element 705 may also be provided to condition the light emitted by the sensor light source 702 as desired. Where multiple light sources 702 are present, separate diffuser elements may be provided above selected light sources or all light sources, or a diffuser ring or connected diffuser structure may be provided to cover some or all of the multiple light sources 702. In certain embodiments, sensor layer 750 also includes an angular selective structure 711 disposed over the sensor (which includes one a plurality of photosensors) as shown in FIG. 7 For example, in an embodiment, the angular selective structure may include a plurality of collimator filter elements or collimators. The collimators operate as a light conditioning layer, interposed between the image sensor and the sensing region above, to help prevent or reduce image blurring. Light illuminating the sensing surface 712 from the display and/or light sources 702 reflects off of the input object 710 at the sensing surface 712 above the cover glass 708. The reflected light is filtered by the collimators such that only certain of the reflected light beams reach optical sensing elements in the sensor. Additional details about the operation, formation and variations of collimator elements according to various embodiments can be found in U.S. Pat. No. 9,829,614, which is incorporated by reference herein for all purposes.

In FIG. 8, the layers shown in FIG. 7 have been separated to discuss the behavior of the light after each interacting with each layer. The discussion will proceed with reference to FIG. 8 by starting with the illumination source (e.g., LED) 802 at the bottom left and working up to the cover glass layer 808 and then back down again to the sensor 850. Again, FIG. 8 represents a special case of the general behavior of the light polarization when interacting with the various elements/layers. In this special case, the linear polarizers are aligned so that a common "x" and "y" axis is used throughout the description. However, the polarization of the light behaves the same when the orientations of the two linear polarizers 816, 824 are not aligned (ie: one linear polarizer is rotated relative to the other).

Light emitted from the illumination source (e.g., LED) 802 is unpolarized at (1). After passing through the linear polarizer 824, at (2), the light is linearly polarized at a 45° angle relative to the quarter wave retarder 822. That is, the linearly polarized light has x and y components (relative to the quarter wave retarder 822) which are in phase with each other. The phase delay for the x and y components is denoted as x:0, y:0 in FIG. 8. At (3), after passing through the quarter wave retarder 822, whose y-axis is the "slow" axis in this example, the phase of the y component is delayed by λ/4. This turns the linear polarization into circular polarization. The light reflected from the display 830 back toward the sensor 850 has its y component delayed by λ/4 again by the quarter wave retarder 822 such that the y component is now 180° (λ/2) out of phase with the x component. The (reflected) light is now linearly polarized in the orthogonal direction to the original light, and is blocked by the linear polarizer 824.

The polarization is unchanged as the circularly polarized light passes though the display 830 at (4). At (5), after passing through the quarter wave retarder 818, whose x-axis is the "slow" axis (in this example, it is rotated 90° relative to the quarter wave retarder 822) in this example, the phase of the x component is now delayed by λ/4. Since the x and y components are delayed by the same amount, they are in phase again and have the same linear polarization as they did after emerging from the linear polarizer 824. At (6), the polarization is unchanged as the light passes through the linear polarizer 816, which has the same orientation. The polarization is unchanged as it passes through the cover glass 808 at (7).

After reflection at the sensing surface 812 of the cover glass 808, at (8), the polarization is unchanged and it is unchanged as it passes through the cover glass 808. The polarization is unchanged as it emerges from the cover glass 808 at (9). At (10), the polarization is unchanged through the linear polarizer 816, which has the same orientation as the polarization of the (reflected) light. At (11), after passing through the quarter wave retarder 818 again, whose x-axis is the "slow" axis, the x-axis component is delayed by another λ/4 so that it is now slower than the y-axis by λ/4. This turns the linear polarization into circular polarization. The polarization is unchanged as it interacts with and passes through the display 830 at (12).

At (13), after passing through the quarter wave retarder 822 again, whose y-axis is the "slow" axis, the y-axis component is delayed by another λ/4 to bring it in phase with the x component. This creates the same linear polarization as earlier at (2) when initially passing through and interacting with the linear polarizer 824. At (14), the polarization is unchanged through the linear polarizer 824, which has the same orientation as the light, so that the light is able to interact with the sensor 850.

The full path shows that the light reflected from the back of the display 830 is blocked, but the light transmitted to the finger and back (through both circular polarizers) is largely unaffected. From a polarization standpoint, there is only one attenuation stage as it passes through the circular polarizer 824. If an LED or other point source is used as the illumination source 802, a circular polarizer can be used above the sensor-light source module layer to reduce or eliminate the reflection from the back of the display.

One skilled in the art will recognize that the preceding discussion of the light interacting with the various layers will work for the general case with different orientations of the constituent linear polarizers as long as the handedness of each circular polarizer (e.g., circular polarizer 720 and circular polarizer 715) is the same.

Figure 9:
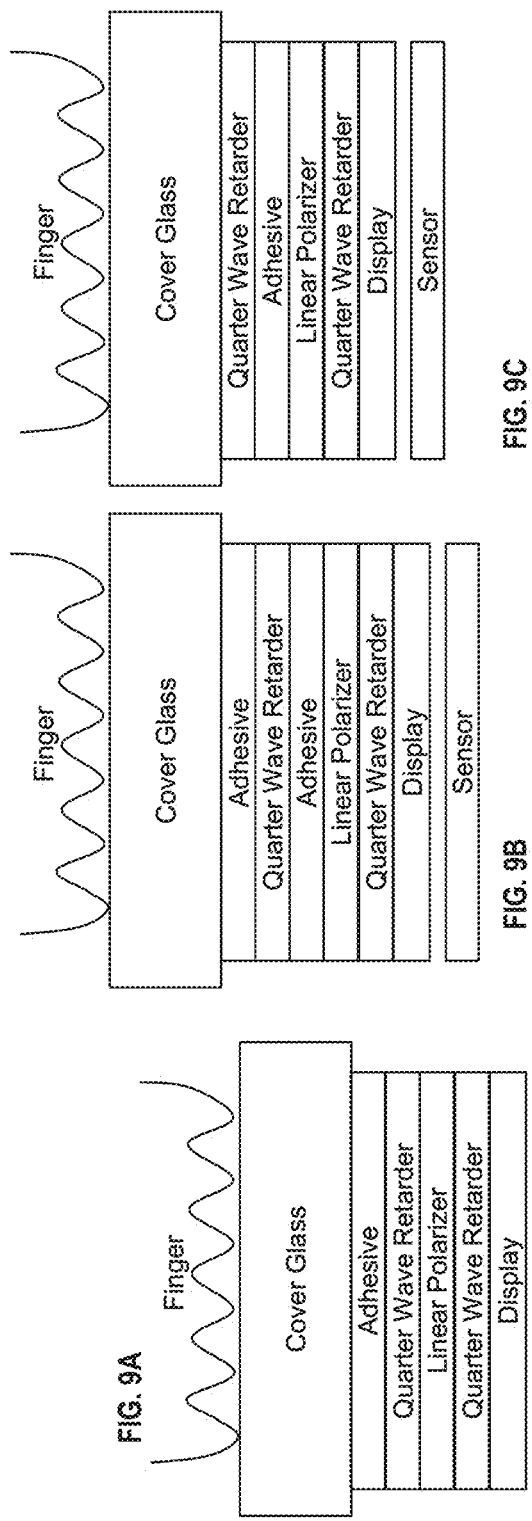
FIGS. 9A, 9B and 9C illustrate embodiments of an optical display device stack-up including additional adhesive layers.

FIGS. 9A, 9B and 9C illustrate embodiments of optical display device stack-ups including one or more additional adhesive layers. FIG. 9A shows an embodiment of an on-display circular polarizer with an added quarter wave retarder similar to the stack-up shown in FIG. 6A with an added adhesive layer to attach the stack up to the cover glass as shown. FIG. 9B shows an embodiment of an on-display circular polarizer with an added quarter wave retarder similar to the stack-up shown in FIG. 6A with an added adhesive layer to attach the stack up to the cover glass and an adhesive layer between the display circular polarizer and the added quarter wave retarder as shown. FIG. 9C shows an embodiment of an on-display circular polarizer with an added quarter wave retarder similar to the stack-up shown in FIG. 6A with an adhesive layer between the display circular polarizer and the added quarter wave retarder as shown.

Figure 10:
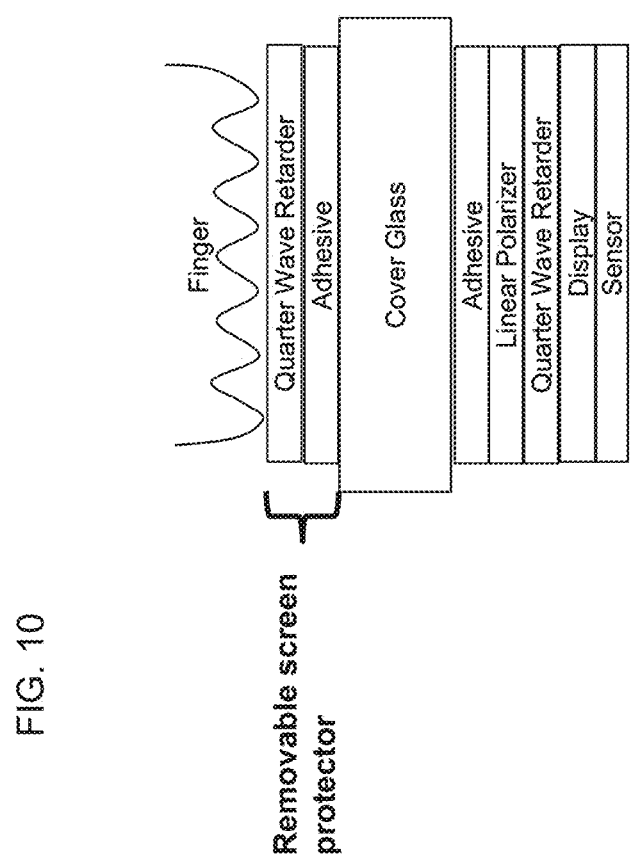
FIG. 10 shows an embodiment of an optical display stack-up including an on-display circular polarizer with a screen protector layer including an added quarter wave plate and having similar functionality to the stack-up shown on the left side of FIG. 6.

FIG. 10 shows an embodiment of an optical display stack-up including an on-display circular polarizer with a screen protector layer including the added quarter wave plate. The stack-up in FIG. 10 is similar in functionality to the stack-up shown in FIG. 6A. In this embodiment, the added quarter wave retarder is located above the cover glass in a screen protector layer. The screen protector layer may be added after formation or distribution of the device embodying the display and display circular polarizer. In this embodiment, the top surface of the quarter wave retarder proximal the top surface of the transparent cover glass provides the sensing surface for the object, e.g., finger.

Figure 11:
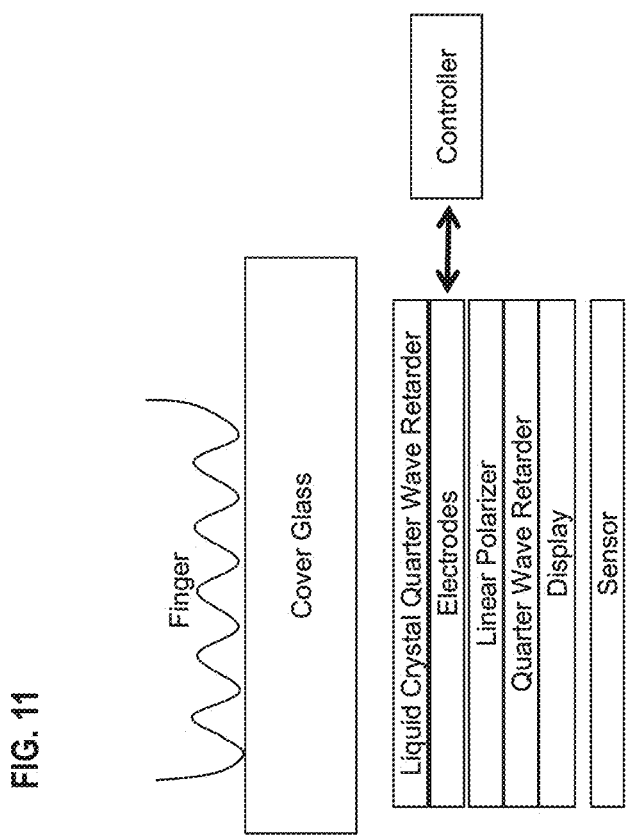
FIG. 11 shows an embodiment of an optical display stack-up including an on-display circular polarizer with a controllable quarter wave retarder.

FIG. 11 shows an embodiment of an optical display stack-up including an on-display circular polarizer with a controllable quarter wave retarder, such as a liquid crystal (LC) quarter wave retarder. The controller applies voltage signals to the electrodes so as to control activation of, or switching between states of, the controllable quarter wave retarder. Activation states might include "on" and "off" states, e.g., so that the device operates similar to FIG. 6A in the "on" state, and similar to FIG. 6B in the "off" state. For example, in an embodiment, an optical image sensor may be disposed below the LC quarter wave retarder, and in operation, the optical image sensor may be configured to obtain a first image when the LC quarter wave retarder is activated or "on", and obtain a second image when the LC quarter wave retarder is de-activated, or "off".

Figure 12A:
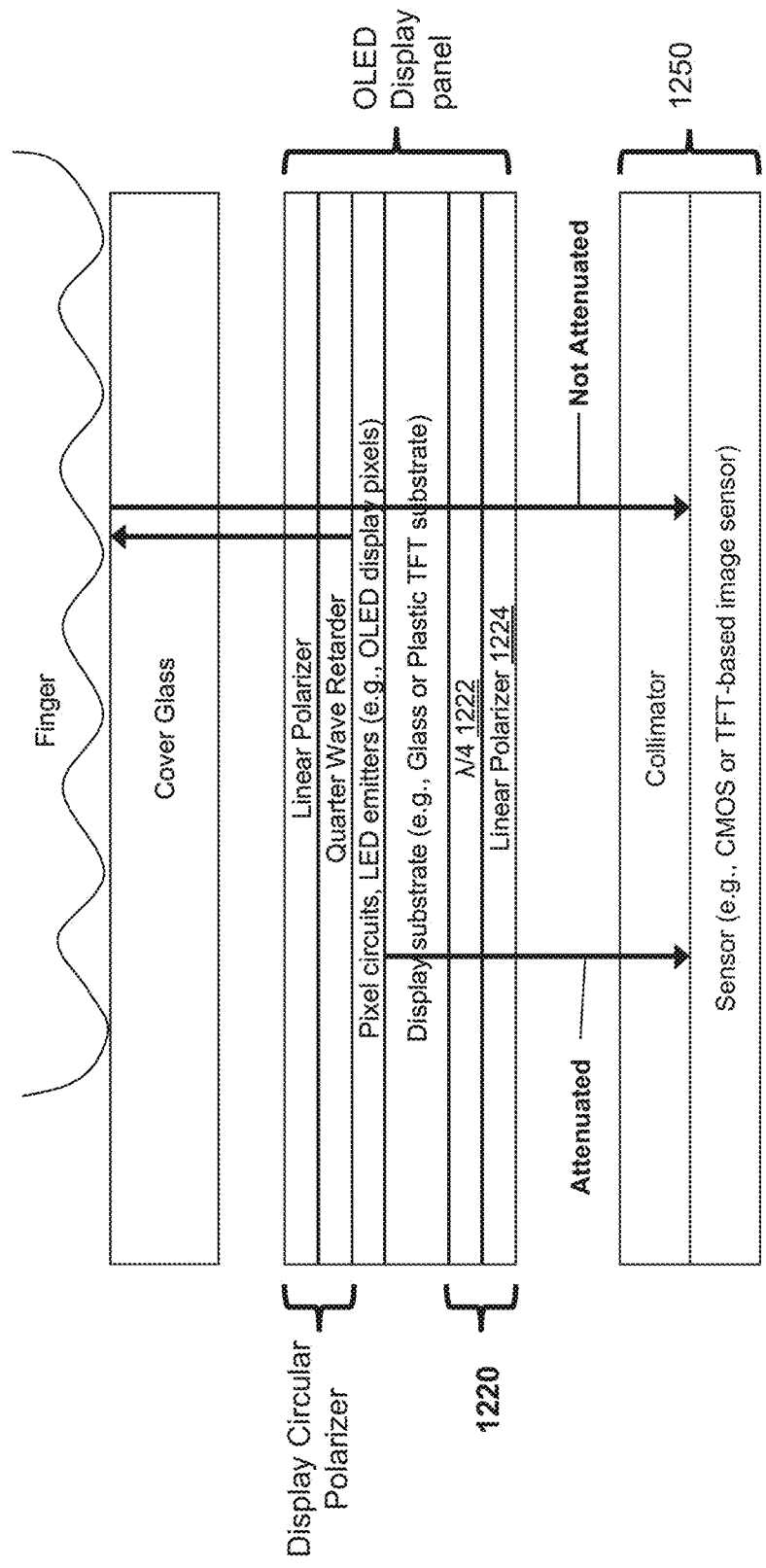
FIG. 12A illustrates an embodiment including a circular polarizer attached the back of a display.

FIG. 12A illustrates an embodiment including a circular polarizer 1220 attached to (e.g., mounted to, adhered to or laminated to) the back of a display substrate (e.g., OLED display stack). In certain embodiments, the quarter wave retarder 1222 is mounted below the display substrate. The linear polarizer 1224 can be mounted to or otherwise disposed below the quarter wave retarder 1222 or display substrate to form the circular polarizer 1220 with quarter wave retarder 1222. For example, a display module including the circular polarizer 1220 (and optionally also the display circular polarizer) may be provided for additional processing to form a desired device stack-up.

Figure 12B:
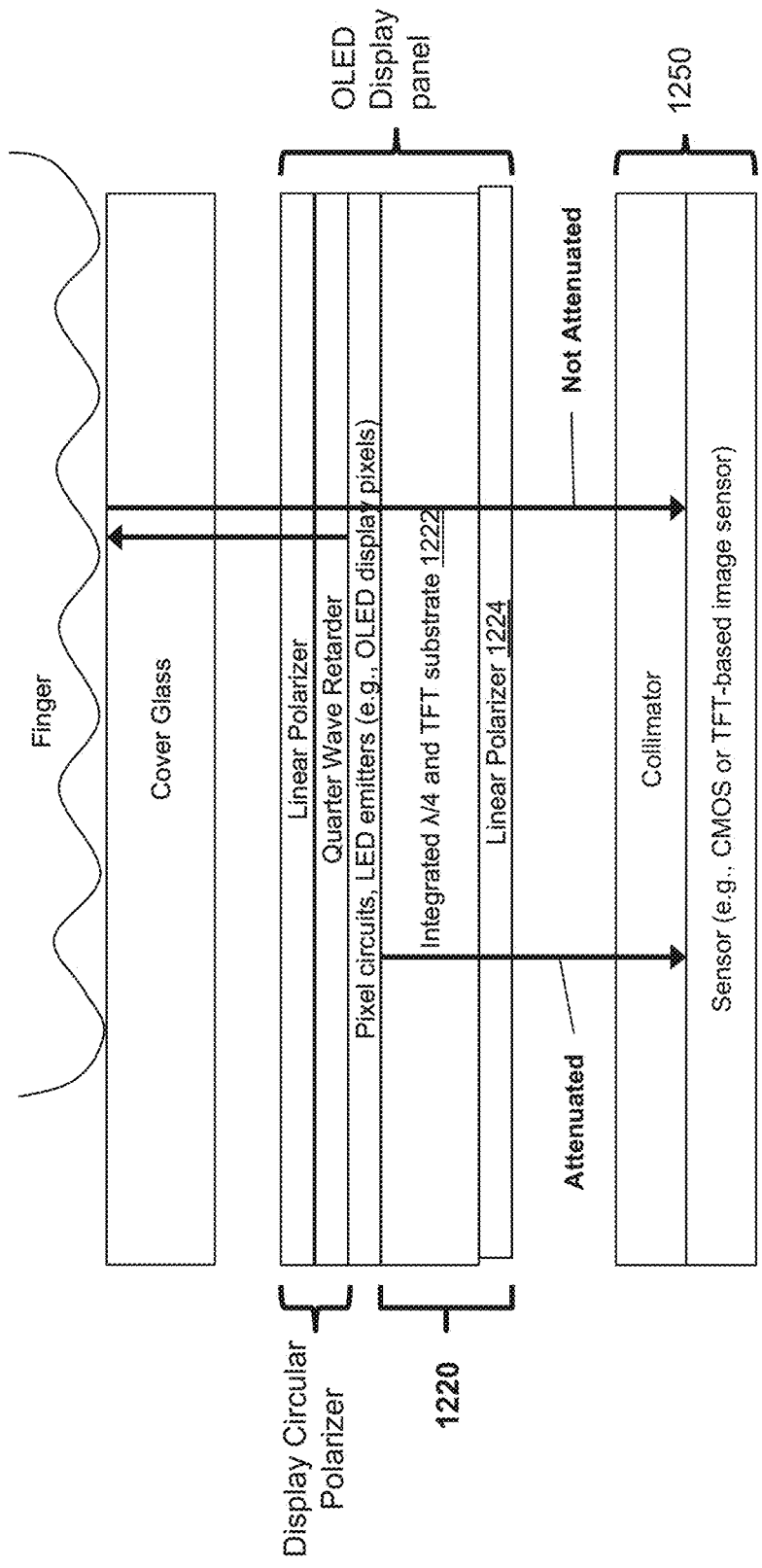
FIG. 12B illustrates an embodiment including a circular polarizer with a quarter wave retarder integrated in a display substrate.

FIG. 12B illustrates an embodiment including a circular polarizer 1220 with the quarter wave retarder integrated in a display substrate 1222. For example, the display substrate carrying display emitters and pixel circuitry can be made of, or otherwise include, a birefringent material having a thickness that forms a quarter wave retarder. The linear polarizer 1224 can be mounted to or otherwise disposed below the quarter wave retarder display substrate 1222 to form the circular polarizer 1220 with quarter wave plate 1222. For example, a display module including the circular polarizer 1220 (and optionally also the display circular polarizer) may be provided for additional processing to form a desired device stack-up.

In certain embodiments, an optical sensor device stack-up may include one or more additional corrective layers that correct for angular polarization effects. Because the polarization impact that a quarter wave retarder has on light traversing the quarter wave retarder is a function of the distance traveled in the birefringent material making up the quarter wave retarder, light traversing a quarter wave retarder at an angle relative to the top and bottom surfaces defining the quarter wave retarder may experience a different polarization effect than light traversing normal to the top and bottom surfaces. For example, the emerging light may be elliptically polarized rather than circularly polarized. To compensate, additional birefringent material may be disposed appropriately to compensate for such angular effects. For example, a birefringent material correction layer made of a birefringent material with an appropriate thickness and/or optical orientation may be disposed between an illumination source and the circular polarizer, or between other device layers as desired.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. Use herein of "over," "above", "below" and other similar directionally relational terms are not intended to indicate direct connection or attachment in the indicated relative direction unless explicitly indicated as such.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Certain embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An optical sensor system, comprising:
    a display substrate;
    display pixel circuitry disposed over the display substrate;
    a first circular polarizer disposed over the display substrate and the display pixel circuitry;
    a transparent cover sheet disposed over the first circular polarizer, wherein a top surface of the transparent cover sheet provides a sensing surface for an object;
    a quarter wave retarder disposed over the first circular polarizer;
    a sensor layer disposed below the display substrate, the sensor layer having a plurality of photosensors; and
    a second circular polarizer disposed between the sensor layer and the display substrate.

2. The optical sensor system of claim 1, further including an angular selective structure disposed between the plurality of photosensors and the second circular polarizer.

3. The optical sensor device of claim 2, wherein the angular selective structure includes a plurality of collimator filter elements.

4. The optical sensor device of claim 1, further including a plurality of light emitters disposed over the display substrate, wherein the plurality of photosensors are configured to detect light emitted from the plurality of light emitters and returned through both the first circular polarizer and the second circular polarizer.

5. The optical sensor device of claim 1, further including a light source disposed below the display substrate.

6. The optical sensor device of claim 5, further including a diffuser element disposed between the light source and the display substrate.

7. The optical sensor device of claim 1, further including a birefringent material correction layer to correct for angular polarization effects disposed between the sensor layer and the second circular polarizer.

8. The optical sensor device of claim 1, wherein the quarter wave retarder is disposed over the transparent cover sheet.

9. The optical sensor device of claim 1, wherein a handedness of the first circular polarizer is the same as a handedness of the second circular polarizer.

10. An optical display device, comprising:
    a display substrate;
    display pixel circuitry disposed over the display substrate;
    a circular polarizer disposed over the display substrate and the display pixel circuitry;
    a transparent cover sheet disposed over the circular polarizer, wherein a top surface of the transparent cover sheet provides a sensing surface for an object; and
    a quarter wave retarder disposed over the circular polarizer.

11. The device of claim 10, wherein the quarter wave retarder is disposed over the top surface of the transparent cover sheet, wherein a top surface of the quarter wave retarder proximal the top surface of the transparent cover sheet provides the sensing surface for the object.

12. The device of claim 10, wherein the quarter wave retarder is disposed between the transparent cover sheet and the circular polarizer.

13. The device of claim 10, wherein the quarter wave retarder comprises a liquid crystal (LC) quarter wave retarder and a plurality of electrodes, wherein application of a voltage to the plurality of electrodes controls an activation state of the LC quarter wave retarder.

14. The device of claim 13, further comprising:
    an optical image sensor disposed below the LC quarter wave retarder, wherein the optical image sensor is configured to obtain a first image when the LC quarter wave retarder is activated and obtain a second image when the LC quarter wave retarder is de-activated.

15. The device of claim 10, further including a second circular polarizer disposed below the display substrate.

16. The device of claim 10, further including a sensor layer comprising a plurality of photosensors disposed below the circular polarizer.

17. An optical fingerprint sensor device, comprising:
    an image sensor layer having a plurality of photosensors;
    an angular selective structure disposed over the image sensor layer;

a circular polarizer disposed over the image sensor layer, wherein the circular polarizer includes a quarter wave retarder layer disposed over a linear polarizer layer; and a quarter wave retarder disposed over the circular polarizer.

18. The optical sensor device of claim 17, wherein the angular selective structure includes a plurality of collimator filter elements.

19. The optical sensor device of claim 18, further including a light source configured to illuminate a sensing area over the angular selective structure.

* * * * *